(12) United States Patent
Carrell et al.

(10) Patent No.: US 6,394,440 B1
(45) Date of Patent: May 28, 2002

(54) DUAL ORIENTATION LEVELING PLATFORM FOR SEMICONDUCTOR APPARATUS

(75) Inventors: Jack D. Carrell, Maricopa; Dennis L. Goodwin, Happy Jack, both of AZ (US)

(73) Assignee: ASM America, Inc., Phoenix, AZ (US)

( * ) Notice: Subject to any disclaimer, the term of this patent is extended or adjusted under 35 U.S.C. 154(b) by 3 days.

(21) Appl. No.: 09/624,127

(22) Filed: Jul. 24, 2000

(51) Int. Cl.⁷ ................................................ B23Q 3/00
(52) U.S. Cl. .................... 269/289 R; 156/348; 118/729; 118/730; 414/222; 204/298.15; 269/20
(58) Field of Search .............................. 269/903, 20, 21, 269/56, 254 R, 287, 288, 289 R; 206/298.15; 414/222, 217, 757; 118/729, 730, 728; 156/345

(56) References Cited

U.S. PATENT DOCUMENTS

| | | | |
|---|---|---|---|
| 3,920,233 A | 11/1975 | Stuckert | |
| 3,969,004 A | 7/1976 | Schliemann | |
| 5,037,262 A | * 8/1991 | Moll et al. | 414/222 |
| 5,051,054 A | 9/1991 | Wagner et al. | |
| 5,065,495 A | 11/1991 | Narushima et al. | |
| 5,249,343 A | 10/1993 | Grosso et al. | |
| 5,316,278 A | * 5/1994 | Sherstinsky | 269/254 R |
| 5,352,294 A | * 10/1994 | White | 118/725 |
| 5,738,574 A | * 4/1998 | Tolles | 451/288 |
| 5,772,773 A | * 6/1998 | Wytman | 118/729 |
| 5,804,042 A | * 9/1998 | Ferreira | 204/192.12 |
| 5,860,640 A | 1/1999 | Marohl et al. | |

* cited by examiner

Primary Examiner—Joseph J. Hail, III
Assistant Examiner—Daniel Shanley
(74) Attorney, Agent, or Firm—Knobbe, Martens, Olson & Bear, LLP (57) ABSTRACT

A platform is held atop a vertically moveable dual position leveling base by three draw screws, three push screws, and three spring-loaded pins. The leveling base is configured to secure and orient the platform such that an upper surface of the platform is substantially horizontal with allowance for adjustments in each of two positions. The platform is pushed upwardly relative to the base by the spring-loaded pins. The orientation of the platform in one position is adjusted by the three draw screws, which pull the platform down against the upward force of the spring-loaded pins. The base also has an upper position in which the platform is pressed into sealing engagement with a lower mating surface of a chamber. Three adjustable push screws provide the desired platform orientation by limiting the movement of the platform towards the base.

33 Claims, 8 Drawing Sheets

DUAL ORIENTATION LEVELING PLATFORM FOR SEMICONDUCTOR APPARATUS

BACKGROUND OF THE INVENTION

1. Field of the Invention

This invention relates generally to an apparatus, having a platform that has two leveling orientations for handling semiconductor wafers in a manufacturing apparatus.

2. Description of the Related Art

Some semiconductor handling apparati include a vertically movable platform that holds and moves wafers before, during, and after a wafer treatment step. In one configuration, a wafer holding platform has two positions, a wafer loading position, and a second position in which cleaning, processing or other function may be performed. A wafer handling apparatus loads a wafer onto the platform when the platform is in the loading position. In order to properly load the wafer onto the platform, the wafer handling apparatus must be properly aligned with the platform when the platform is in the loading position. The platform is preferably aligned to receive the wafer in a plane that is parallel to the plane in which the handling apparatus is configured to deliver the wafer.

Once a wafer has been loaded onto the platform, the platform is moved to an upper position in which an upward facing sealing surface of the platform seals against a downward facing sealing surface of an upper chamber. The platform is moved upwards to allow the chamber to cap the platform, encapsulating the wafer in the upper chamber. In order to achieve an effective seal between the platform and the chamber, the sealing surface of the platform is preferably aligned to be parallel to the sealing surface of the chamber.

Depending upon the construction and design of the apparatus, the orientation of the wafer handling apparatus in one chamber may be slightly different from the orientation of the second chamber. Further, among several machines of the same model or design, there may be several different relative orientations between the wafer handling apparati and the other chambers. Accordingly, it would be advantageous to enable a platform to have a first adjustable orientation when the platform is in a first position and a second adjustable orientation when the platform is in a second position.

SUMMARY OF THE INVENTION

In the preferred embodiment, the present invention provides a dual orientation leveling platform for a semiconductor apparatus. The platform is preferably held atop a vertically moveable dual position leveling base by three draw screws, three push screws, and three spring-loaded pins. The leveling base is preferably configured to secure and orient the platform such that an upper surface of the platform is substantially horizontal with allowance for adjustments in each of two positions. When the base is in a wafer loading position, the platform is pushed to an upper position relative to the base by the spring-loaded pins. The orientation of the platform in the wafer loading position is preferably adjusted by the three draw screws, which pull the platform down against an upward force of the spring-loaded pins. The base also has an upper position in which the platform is forced into engagement with a lower mating surface of an upper chamber. The orientation of the platform in this sealing position is preferably adjusted by adjusting the height of the push screws, which limit the downward movement of the platform into the desired orientation with respect to the upper chamber. The draw screws can move downwardly with the platforms to enable the platform to move into a sealing position.

BRIEF DESCRIPTION OF THE DRAWINGS

Referring now to the drawings in which like reference numbers represent corresponding components throughout.

DETAILED DESCRIPTION OF THE EMBODIMENTS

In the following description, reference is made to the accompanying drawings, which form a part hereof, and which show, by way of illustration, specific embodiments in which the invention may be practiced. In some instances, numerous specific details are set forth in order to provide a thorough understanding of the present invention. The present invention, however, may be practiced without the specific details or with certain alternative equivalent devices and methods to those described herein. In other instances, well-known methods and devices have not been described in detail so as not to unnecessarily obscure aspects of the present invention.

Figure 1A:
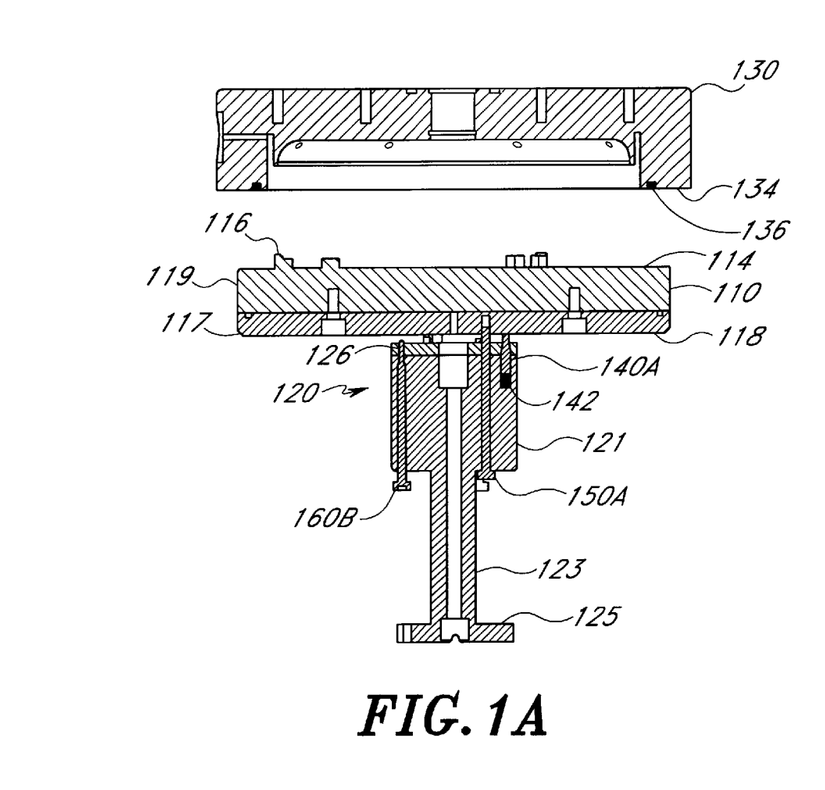
FIGS. 1A–B illustrate elevational cross section views of a dual orientation leveling platform and base shown in a wafer loading position and an upper position relative to an upper chamber.
Figure 1B:
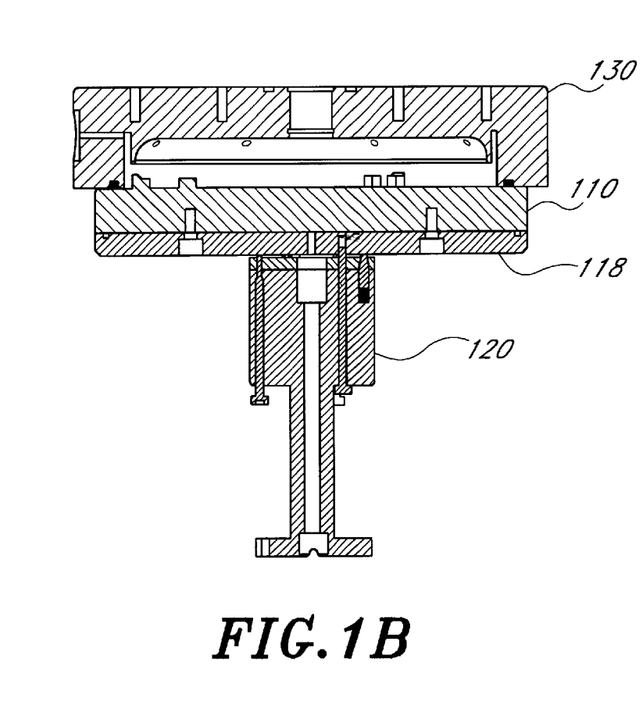

FIGS. 1A–B illustrate elevational cross section views of a preferred embodiment of the invention. A platform or plate 110 is held atop a vertically moveable dual position leveling base 120. The leveling base 120 is preferably configured to secure and orient the platform 110 such that an upper surface of the platform 112 is substantially horizontal (perpendicular to vertical) with allowance for adjustments in each of two positions as will be described below. In FIG. 1A, the base 120 is shown in a wafer loading position relative to an upper chamber body 130. In FIG. 1B, the base 120 is shown in a position relative to the upper chamber body 130 such that an upper surface 112 of the platform 110 forms a lower portion of a chamber 132.

The chamber body 130 has a body mating surface 134 that faces the platform 110. An annular seal 136 is preferably inlaid into the body mating surface 134.

The platform 110 is preferably formed from a lower disc 117 and an upper disc 119. The lower disc 117 preferably incorporates structure necessary for leveling the platform 110. The upper disc 119 may be provided with wafer supports 116. The platform 110 has an upper surface 112 and a lower surface 118. A circumferential edge 114 of the upper surface 112 preferably makes contact with the seal 136 and possibly the body mating surface 134 in order to seal the processing chamber 132.

The base 120 preferably is formed from a base body 121 on a tubular pedestal 123 supported on a mounting plate 125. The base body 121 preferably sits atop the pedestal 123, which preferably sits atop the mounting plate 125. The base 120 is preferably centered on a substantially vertical axis (not shown). The base 120 is illustrated as a one-piece unit but can alternatively be formed from separate components.

The base body 121 preferably includes three compression force generation elements. In the preferred embodiment, the compression force generation elements are spring-loaded pins 140A–C (FIGS. 1A–B and 2A–B) that extend substantially vertically up from an upper surface 222 (FIG. 2B) of the base 120. The pins 140A–C are preferably pushed upwards by three compression springs 142 captured in sockets in the base 120. In alternative embodiments, other types of springs, such as leaf springs, may be used. The pins 140A–C, in turn, make contact with the lower surface 118 of the platform 110 so as to push the platform 110 upwards. The springs 142 are selected to be strong enough to lift the platform 110 and a wafer a distance off of the upper surface 222 of the base 120 to permit leveling of the platform 110.

The base body 121 also preferably includes three plate retaining elements. In the preferred embodiment, the plate retaining elements are draw screws 150A–C (FIGS. 1A–B and 2A–B) that extend substantially vertically through the base body 121 and up from the upper surface 222 (FIG. 2B) of the base 120. Each draw screw 150 has a head, a shaft, and threads at the end of the shaft. Each screw 150 is configured such that the head extends from and seats upon a bottom surface 224 (FIG. 2A) of the base 120. The holes in the base for the draw screw 150 are preferably unthreaded to allow the screw 150 to slide freely up and down within the base 222. The draw screws 150A–C thread into threaded recesses in the lower disc 117 of the platform 110. As each draw screw 150 is tightened, it draws the platform 110 down toward the upper surface 222 of the base 120, counteracting the upward force of the spring-loaded pins 140.

The base body 121 also preferably includes three plate seating elements. In the preferred embodiment, the plate seating elements are push screws 160A–C (FIGS. 1A–B and 2A–B) that extend substantially vertically through the base body 121 and up from the upper surface 222 (FIG. 2B) of the base 120. Each push screw 160 preferably has a head, a threaded upper shaft portion, and a tip configured to seat against the lower surface of the platform 118. The threaded shaft portion of each push screw 160 preferably threads through a corresponding threaded hole in a disc 126 that forms the upper end of the base body 121. The base holes for the screw 160 may be unthreaded so the push screws move easily within the body 121.

Figure 2A:
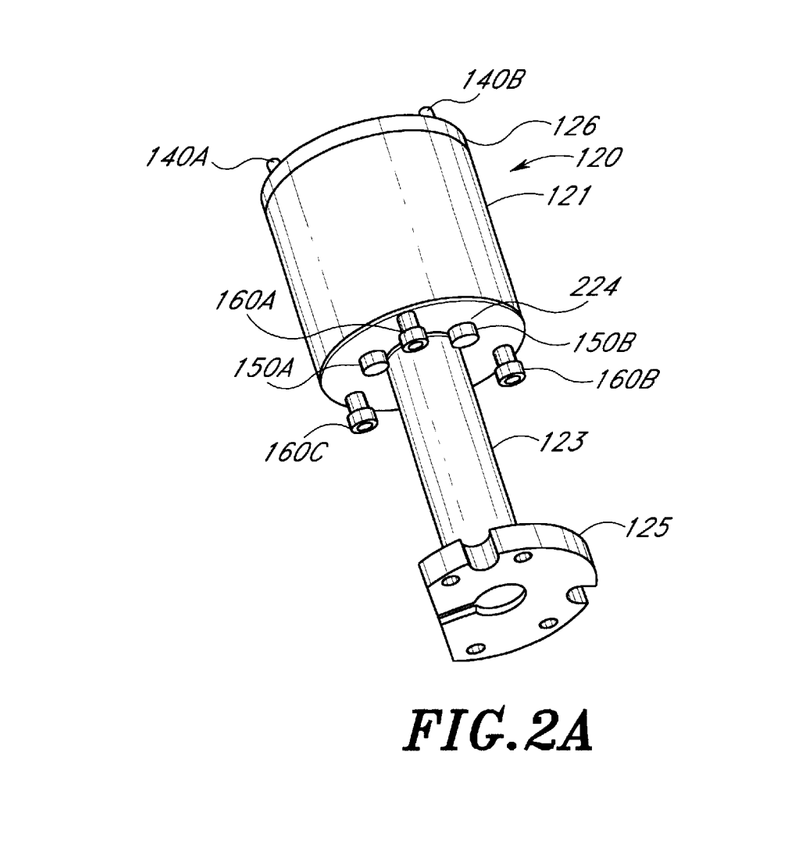
FIGS. 2A–B illustrate two perspective views of the base.
Figure 2B:
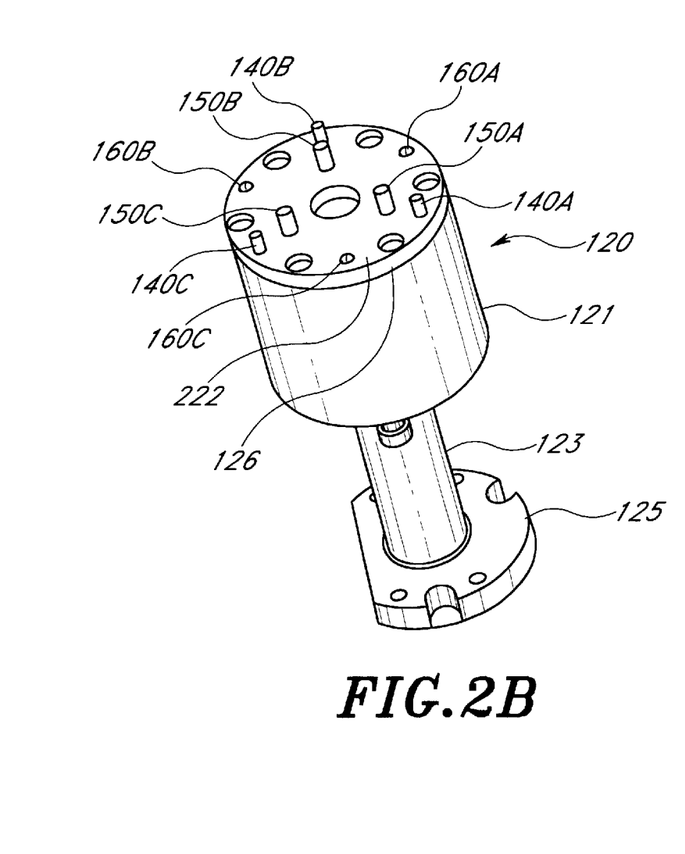

FIGS. 2A–B show the preferred locations of the pins 140A–C, the draw screws 150A–C, and the push screws 160A–C in relation to the base body 121. The pins 140A–C are preferably circumferentially spaced equidistant on a circle centered on the vertical axis of the base 120. The push screws 160A–C are preferably located equidistant between the pins 140A–C along the same circle. The draw screws 150A–C are preferably located equidistant along a smaller circle also centered on the vertical axis of the base. The draw screws 150A–C are preferably also on radially aligned with pins 140A–C.

When the base 120 is in a wafer load/unload position as illustrated in FIG. 1A, the three draw screws 150 retain the platform 110 in an upper position relative to the base 120 against the upward force of the compression springs 142. The draw screws 150 provide a first orientation of the platform 110 relative to the base 120. The force of the compression springs 142 holds the platform 110 up such that the lower surface 188 of the platform 110 is spaced a short distance above the push screws 160A–C.

When the base 120 is in a position as illustrated in FIG. 1B, the three push screws 160 support the platform 110 in a lower position relative to the base 120. In this configuration, the platform 110 has been pushed down towards the base 120 by the chamber body mating surface 134 against the upward force of the spring-loaded pins 140A–C and into contact with the three push screws 160.

Figure 3:
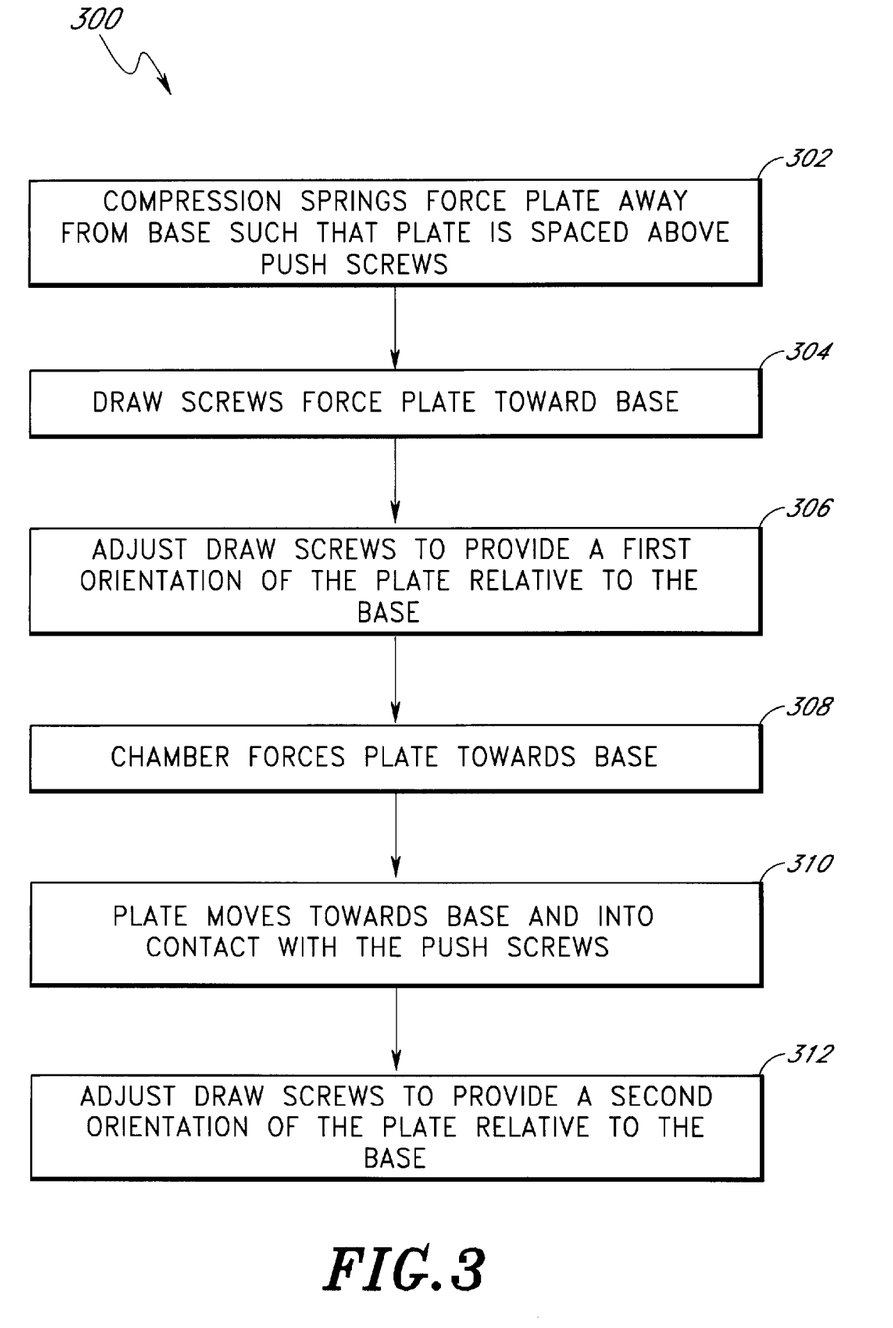
FIG. 3 is a flowchart of a process by which the invention provides two separate leveling orientations for the platform.

FIG. 3 is a flowchart 300 of a process by which the invention provides two separate leveling orientations for the platform 110. At a first step 302, the base 120 is preferably in a wafer loading position as illustrated in FIG. 1A. The compression springs 142 force the platform 110 away from the base 120 such that the platform 110 is spaced above the push screws 160A–C in an upper position relative to the base 120. At a step 304, which is essentially simultaneous with the step 302, the heads of the draw screws 150A–C come into contact with the bottom surface 224 of the base 120 to check upward movement of the platform 110.

At a next step 306, the draw screws 150A–C are adjusted to provide the first orientation of the platform 110 relative to the base 120. The draw screws 150A–C can also be adjusted up or down in unison, such as by one turn each, to adjust the upper vertical position (height, as opposed to orientation) of the platform 110 relative to the base 120. The first orientation and upper vertical position of the platform 110 are preferably adjusted to match the orientation and vertical position of a wafer handling device, such as an arm or a wand (not shown), that places wafers on and removes wafers from the platform 110 when the base 120 is in the wafer loading position.

At a step 308, the base 120 is moved upwards such that the platform 110 contacts the mating surface 134 of the chamber body 130. At a step 310, as the base 120 continues to move upward, the compression springs 142 begin to compress and the platform 110 carrying the draw screws 160, moves closer to the base. This closes the spacing between the platform 110 and the push screws 160A–C and brings the platform to a lower position relative to the base 120. The platform can in effect self-orient by moving against the spring load pins 140 into a level position with respect to the mating chamber surface.

At a step 312, the push screws 160A–C are adjusted to provide stops for the platform 110 at the desired second orientation relative to the base 120. The push screws 160A–C can also be adjusted up or down in unison, such as by one turn each, to adjust the lower vertical position (height, as opposed to orientation) of the platform 110 relative to the base 120. The second orientation of the platform 110 is preferably adjusted such that the platform's circumferential edge 114 is forced against the body mating surface 134 with even pressure to create an effective seal. The platform 110 is preferably parallel to the body mating surface 134 in this configuration.

The process illustrated in flowchart 300 is preferably performed once to provide the first and second orientations of the platform 110. After the push and pull screws 150A–C, 160A–C have been adjusted, the base 120 can be raised and lowered in the normal course of use. The platform 110 will automatically adopt the first and second orientations at the lower and upper positions respectively. Periodic realignment may be performed as necessary by repeating the process of flowchart 300.

Figure 4A:
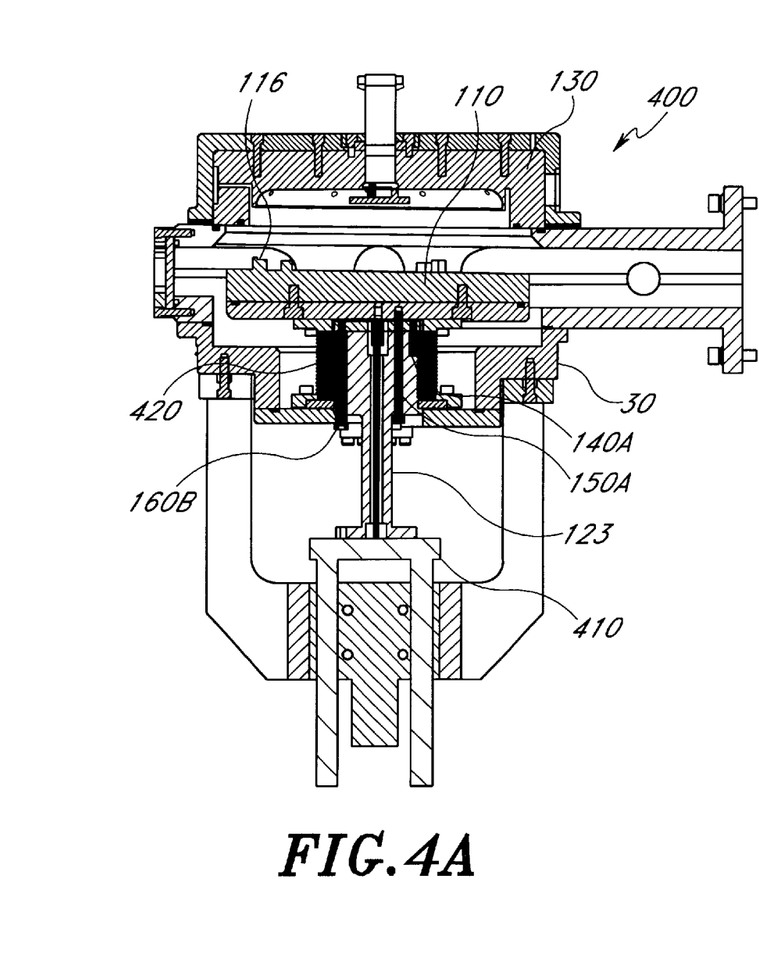
FIGS. 4A–B illustrate elevational cross section views of an apparatus incorporating the platform, the base, and an upper chamber.
Figure 4B:
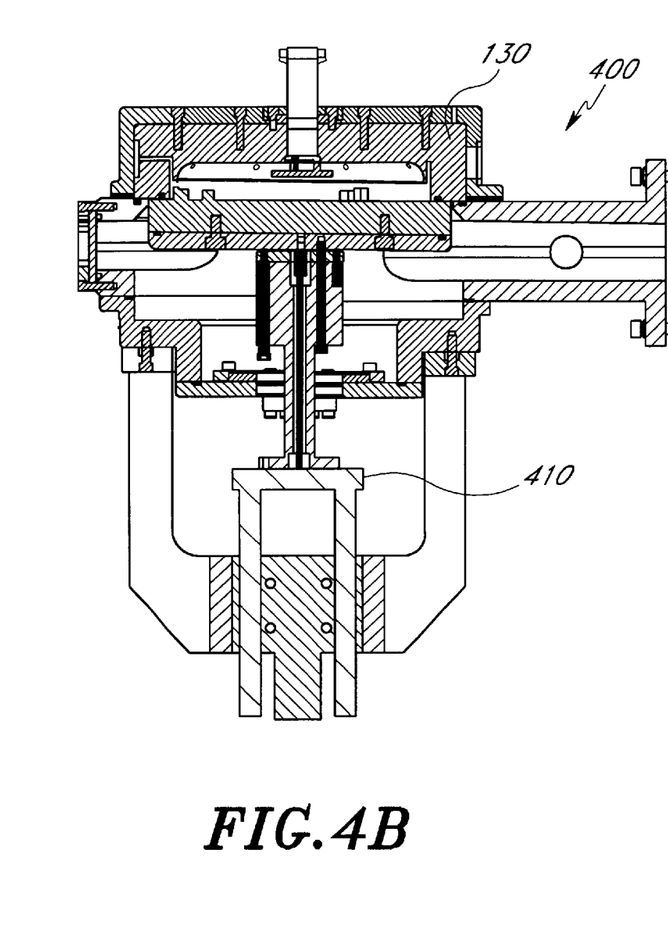

FIGS. 4A–B illustrate elevational cross section views of an apparatus 400 incorporating the platform 110, the base 120, and the chamber body 130. The base 120 is mounted to air cylinder 310 that moves the base 120 between the lower wafer loading (FIG. 4A) and upper (FIG. 4B) positions. As illustrated in FIG. 4A, a flexible bellows 420 is mounted between the platform 110 and a lower surface of a loading chamber 430. The bellows 420 isolates the loading chamber 430 from the base 120 and its various adjustable screws and parts, which could cause contamination. The bellows 420 is not shown in FIG. 4B for purposes of clarity.

Figure 5A:
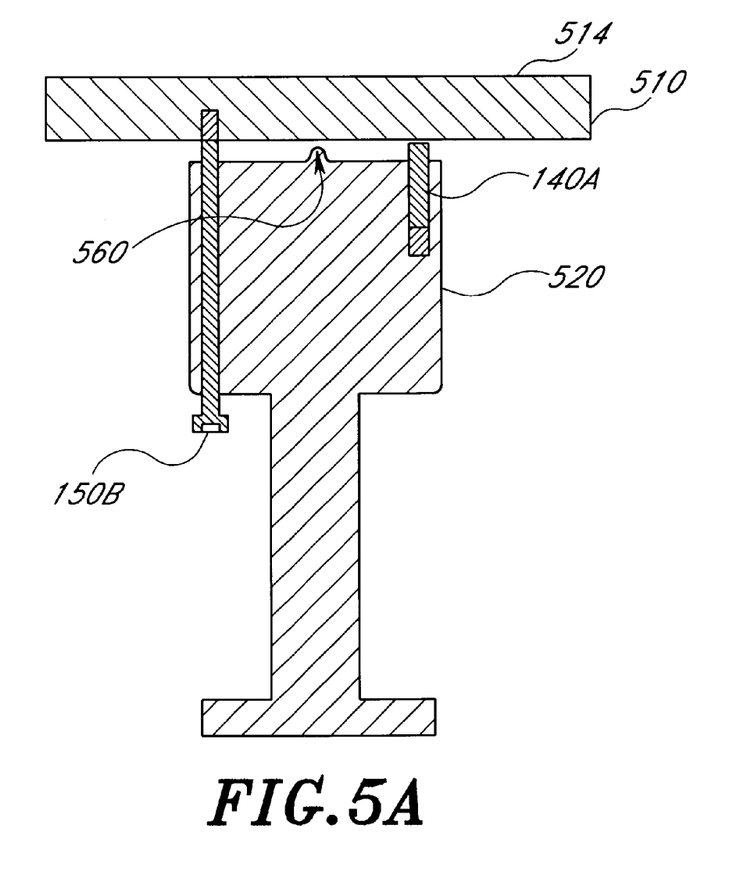
FIGS. 5A–B illustrate an alternative embodiment of the invention.
Figure 5B:
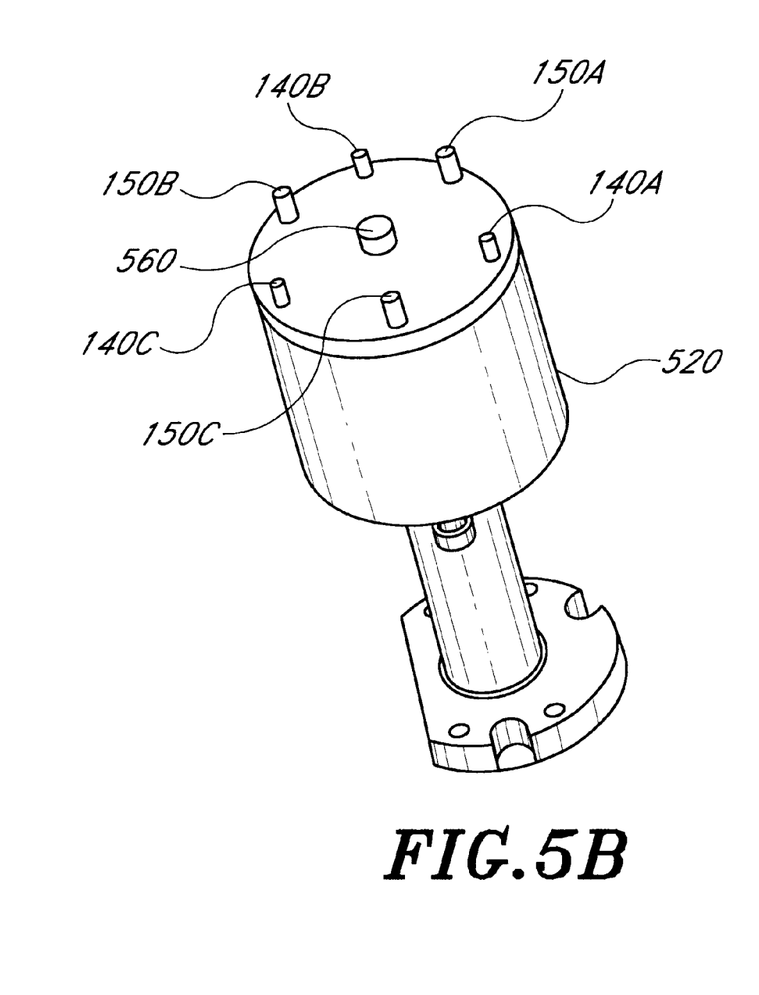

FIGS. 5A–B illustrate an alternative embodiment of the invention. FIG. 5A illustrates an elevational cross section of the platform 510 and the base 520. FIG. 5B illustrates a perspective view of the base 520. In the alternative embodiment, the three push screws 160A–C of the preferred embodiment are replaced by a single stationary pin or protrusion 560 centered on the vertical axis of the base 320. The three draw screws 150A–C are retained, but are moved to the no longer used locations of the three push screws 160A–C in the preferred embodiment. The single pin 560 preferably contacts the center of the underside of the platform 510 when the platform 510 is forced towards the base 520 against the pressure of the spring loaded pins 140A–C. Due to the use of a single pin 560, the platform 510 self-levels against the chamber body mating surface 134 when the base 520 is raised into the upper (processing) position. If the chamber body mating surface 134 is substantially perpendicular to the direction in which the base 420 moves, the platform 410 will be forced against the chamber body mating surface 134 with substantially equal pressure along the circumference 514 of the platform 510.

Figure 6A:
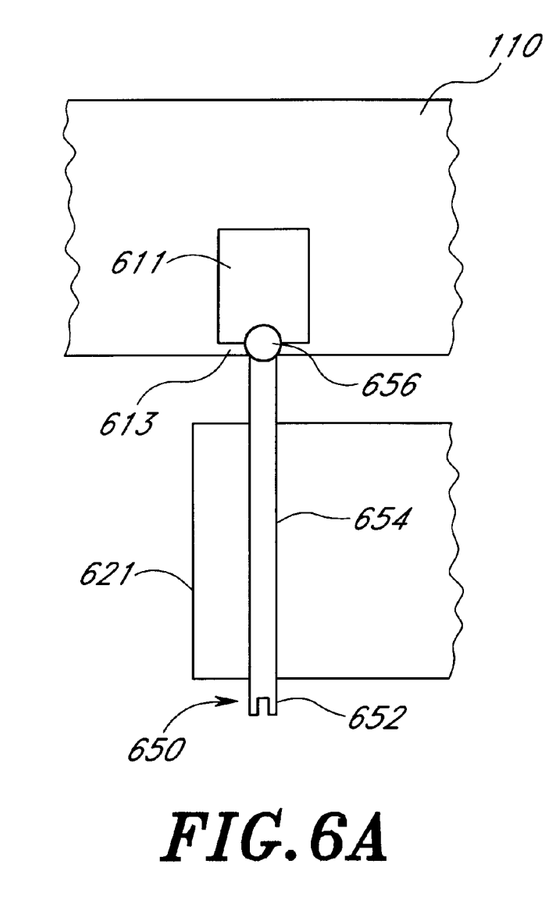
FIGS. 6A–B illustrate a cross section of a draw screw and its associated components in accordance with an additional embodiment of the invention.
Figure 6B:
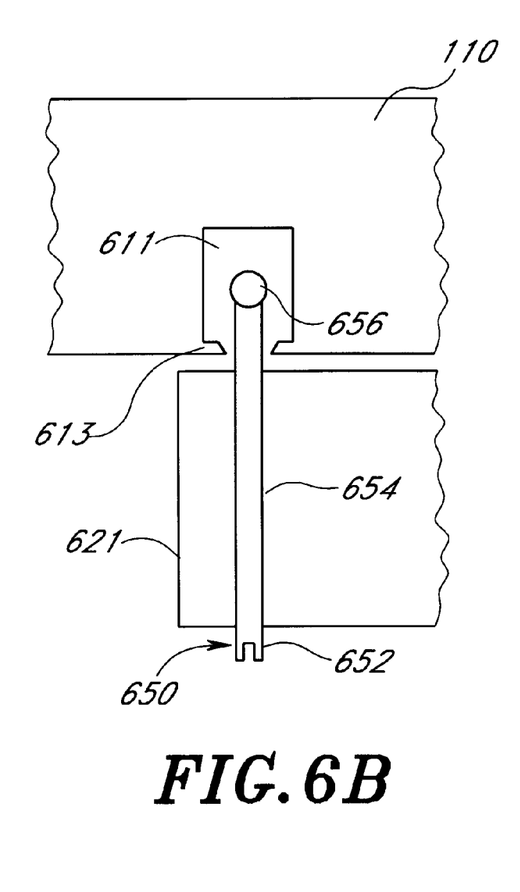

FIGS. 6A–B schematically illustrate a draw screw 650 and its associated components in accordance with an additional embodiment of the invention. The push screws and the spring loaded pins described above may be used with the draw screws 650. The draw screw 650 preferably comprises a head 652, a threaded shaft 654, and a bulbous tip 656. The draw screw 650 is threaded through the base body 621 such that the height of the tip 656 can be adjusted by turning the screw 650. The platform 610 has a cavity 611 the lower end of which preferably forms a retaining seat 613. The retaining seat 613 has an inner diameter that is greater than the diameter of the shaft 654 but less than the diameter of the bulbous tip 656 of the draw screw.

Figure 6C:
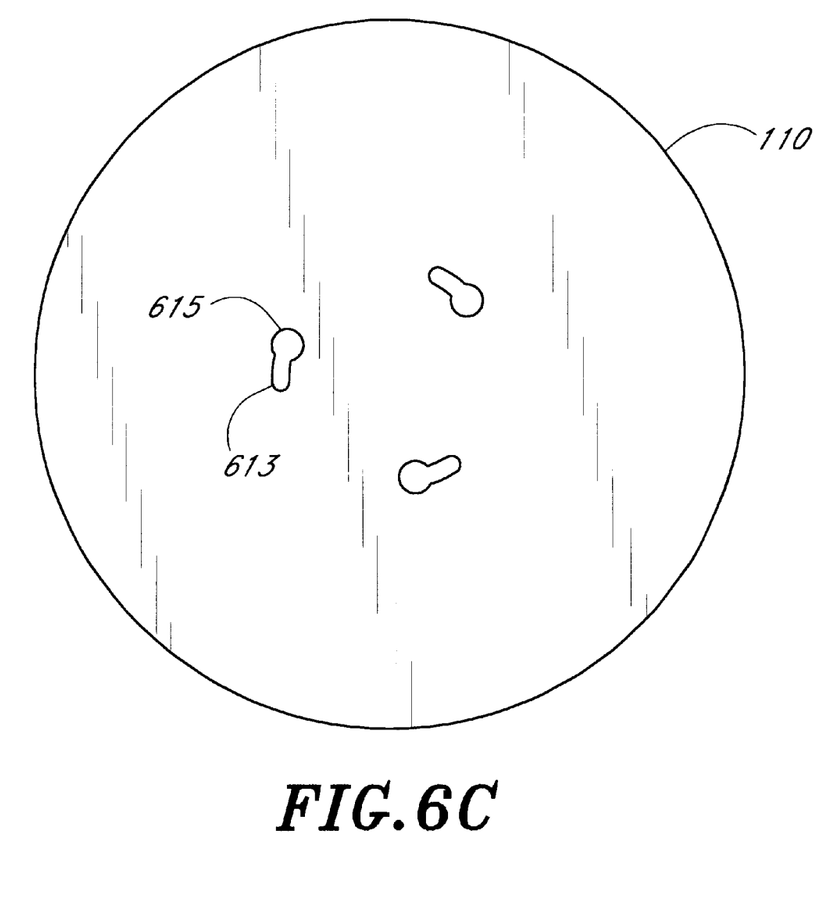
FIG. 6C illustrates a view of the underside of the platform of the embodiment of FIGS. 6A–B.

FIG. 6A shows the platform 610 in the wafer loading position, while FIG. 6B shows the platform 610 in the processing position. FIG. 6C illustrates a view of the underside of the platform 610. The retaining seat 613 is shown adjacent an insertion hole 615 through which the bulbous tip 656 of the draw screw is inserted into the cavity 611 during assembly.

In other embodiments, the number of push screws and the number of spring-loaded pins can be varied, preferably from one to three in each case. The base and platform can also be oriented in positions other than substantially horizontal. In another embodiment, the base is held stationary, and the processing chamber body is moved into contact with the platform. In still other embodiments, objects other than a platform or plate, such as a door or cover, are oriented in two positions by a dual position base.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed. Accordingly, the scope of the invention is defined by the claims that follow.

What is claimed is:

1. An apparatus for supporting a substrate in a manner to be level in two different vertical positions, said apparatus comprising:
   a vertically moveable base;
   a plate adjustably and resiliently supported on said base to be level with respect to a robotic end effector which is adapted to move a substrate to or from a position supported by said plate;
   a chamber above said base having a wall defining an opening into the chamber; and
   said plate being moveable with said base to a position in which the plate engages said chamber wall to close said opening, said plate being automatically and resiliently adjusted when engaging said wall to be level with respect to the wall opening so that the plate provides a good seal with said chamber opening.

2. An apparatus for supporting a substrate in a manner to be level in two different vertical positions, said apparatus comprising:
   a vertically movable base;
   a plate supported on said base;
   a chamber above said base having a wall defining an opening into the chamber;
   at least one compression force generation element configured to force the plate away from the base;
   a plurality of plate retaining elements configured to retain the plate in a first orientation relative to the base in position to receive a substrate; and
   at least one plate seating element configured to seat the plate in a second orientation relative to the base to seal said chamber opening.

3. The apparatus of claim 2, wherein said first orientation relative to the base, is to some extent further from the base than the second orientation.

4. The apparatus of claim 2, wherein the at least one plate seating element is configured to seat the plate against a force upon the plate in the direction of the base.

5. The apparatus of claim 2, wherein each of the plate retaining elements is adjustable.

6. The apparatus of claim 5, wherein each of the plate retaining elements is a draw screw.

7. The apparatus of claim 6, wherein the draw screw comprises a head, a shaft, and a threaded end, and wherein the shaft slidably extends through the base, wherein the threaded end threads into the plate, and wherein the head limits movement of the shaft through the base.

8. The apparatus of claim 6, wherein the draw screw comprises a head, a threaded shaft, and a bulbous tip, wherein the shaft is threaded through the base, wherein the plate has a cavity at least partially bounded by a retaining seat, and wherein the bulbous tip extends into the cavity and seats on the retaining seat.

9. The apparatus of claim 2, wherein the plate seating element is adjustable.

10. The apparatus of claim 9, wherein the plate seating element is a push screw.

11. The apparatus of claim 10, wherein the push screw comprises a head, a threaded shaft, and a tip, wherein the shaft is threaded through the base, and wherein the plate is configured to seat against the tip.

12. The apparatus of claim 2, wherein the compression force generation element is a spring-loaded pin.

13. The apparatus of claim 12, wherein the spring-loaded pin is seated within the base and extends from the base to contact the plate.

14. The apparatus of claim 13, wherein the spring-loaded pin is seated within the plate and extends from the plate to contact the base.

15. The apparatus of claim 2, wherein the compression force generation element is a spring.

16. The apparatus of claim 2, wherein the number of plate retaining elements is three.

17. The apparatus of claim 16, wherein the number of plate seating elements is three.

18. The apparatus of claim 17, wherein the number of compression force generation elements is three.

19. The apparatus of claim 18, wherein the three plate retaining elements are spaced equidistant along a first circle centered on a vertical axis of the base.

20. The apparatus of claim 19, wherein the three plate seating elements are spaced equidistant along a second circle centered on the vertical axis of the base.

21. The apparatus of claim 20, wherein the three compression force generation elements are spaced equidistant along a third circle centered on the vertical axis of the base.

22. The apparatus of claim 21, wherein the second circle and the third circle are the same circle, and wherein the compression force generation elements are spaced evenly between the plate seating elements.

23. The apparatus of claim 22, wherein the diameter of the first circle is less than the diameter of the second circle, and wherein the plate retaining elements are positioned on radii that extend perpendicular from the vertical axis of the base to each of the compression force generation elements.

24. The apparatus of claim 2, further comprising a bellows, wherein the bellows is attached to the plate, and wherein the bellows is configured to cover a portion of the plate, a portion of the base, the at least one compression force generation element, the plurality of plate retaining elements, and the at least one plate seating element.

25. A method of providing two orientations of a substrate supporting plate relative to a base, the method comprising:

forcing the plate away from the base using at least one compression force generation element;

retaining the plate against the force of the at least one compression force generation element using a plurality of plate retaining elements;

adjusting the plurality of plate retaining elements to provide a first orientation of the plate relative to the base;

positioning a substrate on the plate; and moving the plate, relative to the base, toward the base and into contact with a wall forming an opening into a chamber to achieve a second orientation of the plate relative to the base and close the opening with the plate.

26. The method of claim 25, further comprising adjusting the at least one plate seating element to adjust the second orientation.

27. The method of claim 25, wherein the second orientation is different than the first orientation.

28. The method of claim 25, wherein the compression force generation element is a spring-loaded pin extending from the base towards the plate.

29. The method of claim 25, wherein each of the plate retaining elements is a draw screw.

30. The method of claim 25, wherein the plate seating element is a push screw.

31. The method of claim 25, wherein the base is moved relative to the plate while the plate remains stationary.

32. An apparatus for supporting a substrate in a manner to be level in two different vertical positions, said apparatus comprising:

a vertically moveable base;

a plurality of spaced, spring loaded, self-adjusting supports extending upwardly from the base;

a plate supported on the supports;

a plurality of spaced draw screws mounted in the base and extending upwardly from the base and being connected to the plate, the draw screws being individually adjustable to draw the plate against the urging of the plurality of supports into a level position for receiving a substrate to be supported on the plate, said draw screws being mounted in the base in a manner to permit the plate to be further pressed towards the base; and a plurality of adjustable push pins mounted on the base and extending toward the plate so that when the plate is moved vertically to mate with a mating structure defining an opening to a chamber, the push pins limit the movement of the plate with respect to the base to seat the plate in sealing engagement with the mating structure.

33. The apparatus of claim 32, wherein the draw screws and the push pins are threadably adjustable so that once they are adjusted they provide the dual position leveling with repeated operations of transferring substrates to and from the plate and vertically moving the plate into and out of a sealing position with respect to the mating structure.

* * * * *